United States Patent [19]

Strenglein

[11] 4,079,321

[45] Mar. 14, 1978

[54] DUAL DIODE HIGH CONVERSION EFFICIENCY SIGNAL MIXER

[75] Inventor: Harry F. Strenglein, Clearwater, Fla.

[73] Assignee: Sperry Rand Corporation, New York, N.Y.

[21] Appl. No.: 678,512

[22] Filed: Apr. 19, 1976

[51] Int. Cl.² ............................................. H03D 7/14
[52] U.S. Cl. .................................. 325/446; 325/449; 325/450; 329/154; 329/166
[58] Field of Search ................ 325/430, 435, 437, 442, 325/445, 446, 450, 449; 329/153, 154, 163, 166; 328/15; 321/60

[56] References Cited

U.S. PATENT DOCUMENTS

| 2,244,799 | 6/1941 | Paddle | 329/163 |
|---|---|---|---|
| 2,550,524 | 4/1951 | Braden | 325/446 |
| 2,621,287 | 12/1952 | Hings | 329/154 |
| 2,628,308 | 2/1953 | Norton | 325/446 |
| 3,634,768 | 1/1972 | Carpenter | 325/450 |

OTHER PUBLICATIONS

"Single Sideband Principles and Circuits"-Pappenfus, Bruene & Schoenike, pp. 105-106, 1964-McGraw-Hill.

Primary Examiner—Robert L. Griffin
Assistant Examiner—Marc E. Bookbinder
Attorney, Agent, or Firm—Howard P. Terry; Seymour Levine

[57] ABSTRACT

A signal mixer utilizing two oppositely poled diodes, coupled to provide parallel operation at high frequencies and series operation at intermediate and low frequencies. This arrangement reduces the number of signals generated by the mixing process with a concomitant increase in conversion efficiency for the desired mixer output signal.

5 Claims, 4 Drawing Figures

4,079,321

DUAL DIODE HIGH CONVERSION EFFICIENCY SIGNAL MIXER

BACKGROUND OF THE INVENTION

1. Field of the Invention

The invention pertains to radio signal mixing apparatus and more specifically concerns the utilization of dual diodes for the achievement of high conversion efficiency signal mixers.

2. Description of the Prior Art

Frequency mixers employing diodes as the non-linear element find wide applications in microwave receivers because of their simplicity, low weight and low cost. However, these mixers exhibit signal losses in the conversion process which contribute to the noise figure of the receiver, thus limiting the range of the over-all system. Thus, a reduction of the mixer conversion loss is translated into an increase in the over-all system range or directly into a reduction of the required transmitted power.

Conventional diode mixers provide an output signal at a frequency which is the difference between the frequency of the local oscillator signal and the frequency of the received signal. Unfortunately, when these two signals are applied to the mixer diode, a great many other signals are generated. The frequency of these signals will be of the form $nF_{LO} \pm mF_S$ where $n$ and $m$ are integers, $F_{LO}$ and $F_S$ are the local oscillator and signal frequencies, respectively. The signal power generated at frequencies other than the difference frequency with $n$ and $m$ both equal to 1, are the major contributors to the conversion loss of the mixer, and the prevention of the generation of these signals can provide a significant improvement in the over-all conversion efficiency. Prior art methods of achieving this result have employed resonant circuits which suppress the unwanted mix products. However, these circuits are band limited and must be retuned whenever a diode is replaced.

SUMMARY OF THE INVENTION

The present invention provides a signal mixer which achieves an increased signal conversion efficiency. This improved conversion efficiency is realized by utilizing two diodes coupled in a manner to provide parallel operation at the local oscillator and signal frequencies and operation in series with the input port of the intermediate frequency (IF) amplifier at the intermediate frequency. This circuitry provides mixer operation during each half cycle of the local oscillator signal which results in a 3db increase in IF signal power over that of a conventional mixer, wherein mixer operation occurs at alternate half cycles of a local oscillator frequency.

DESCRIPTION OF THE PREFERRED EMBODIMENTS

Figure 1:
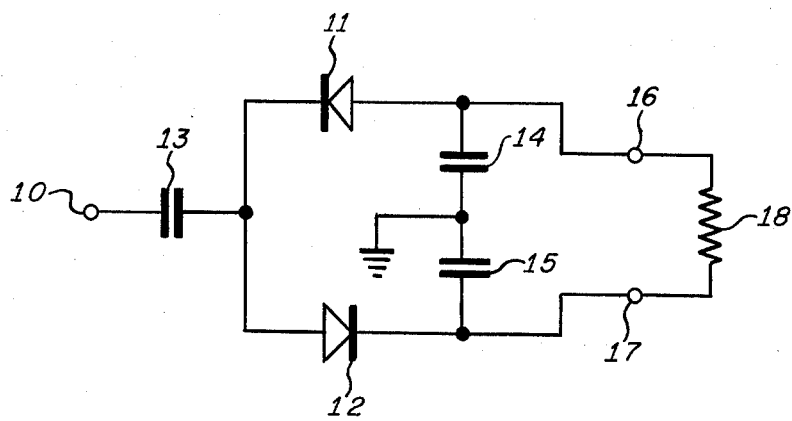
FIG. 1 is a schematic showing of the invention

Referring to FIG. 1, a signal consisting of the local oscillator signal and the received (RF) signal supplied to input terminal 10 is coupled to the cathode of a first diode 11 and to the anode of a second diode 12 via a capacitor 13. The anode of diode 11 and the cathode of diode 12 are coupled to ground via capacitors 14 and 15, respectively, and to opposite terminals 16 and 17, respectively, of the input port of an IF amplifier having an input impedance 18. The reactances of capacitors 14 and 15 is very low at RF signals and very high at IF signals, thus providing parallel operation of diodes 11 and 12 for RF frequencies while providing a series circuit in combination with terminals 16 and 17 of the IF amplifier input port.

Figure 2A:
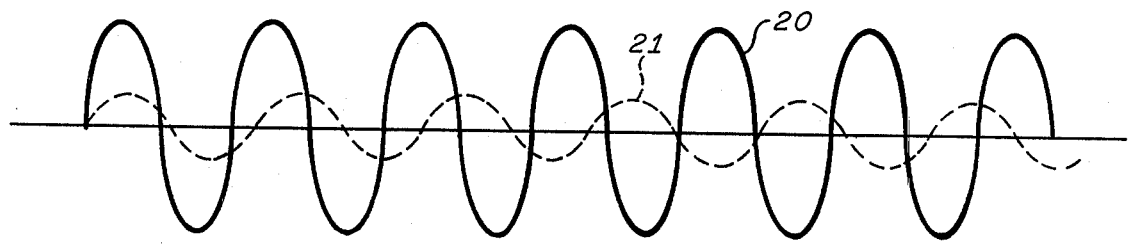
FIGS. 2A through 2C are graphs of waveforms useful in explaining the operation of the invention.
Figure 2B:
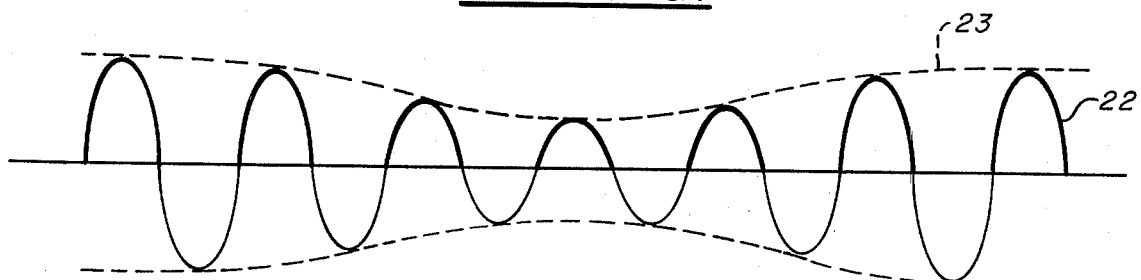
Figure 2C:
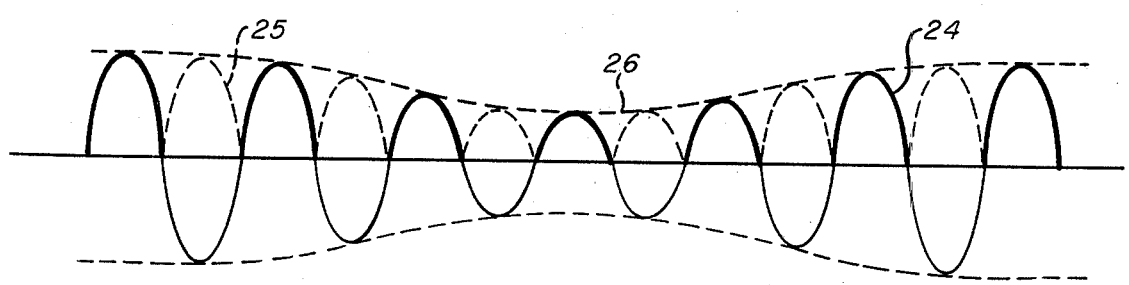

Referring now to FIG. 2A, wherein is shown a representation of a local oscillator signal 20 to which an RF signal 21 is added and to FIGS. 2B and 2C wherein a representation of the resulting diode current due to the sum of RF and local oscillator signals is shown for a single diode mixer and for the mixer of the present invention, respectively. The resulting diode current for single diode mixers consists of pulses of current 22 at alternate half cycles with varying pulse amplitudes. The variation in amplitudes is in accordance with the envelope 23, the frequency of which is equal to the difference in frequency between the local oscillator signal 20 and RF signal 21 frequencies, that is, the intermediate frequency (IF). Thus interaction between the RF signal 21 and the local oscillator signal 22 occur only at every other half cycle and potential IF signal energy is consequently diverted to other frequency combinations of the local oscillator and signal frequencies. Refer now to FIG. 2C, wherein the resulting diode currents of the present invention is shown. Since the diode 11 has a polarity opposite to the polarity of the diode 12 (FIG. 1), the negative half cycles of the composite RF and local oscillator signals are rectified, resulting in current pulses 25 and 26 for each half cycle. Consequently, the diode currents are in the same direction and a series circuit for the two diodes 11 and 12 and the IF amplifier input impedance 18 is established. Interaction between the RF signal 21 and the local oscillator 20 occurs for each half cycle and the current pulse amplitudes vary within the envelope 26 which represents the IF signal. This increased RF local oscillator signal interaction results in a reduction in the number of frequency components generated and in an IF voltage at the IF amplifier input terminals 16 and 17 that is essentially twice that of the prior art single diode mixer. This voltage is produced from a source that has an impedance twice that of the single diode, thus doubling the output power available and providing a 3db increase in the conversion efficiency of the mixer of the present invention over that of the prior art single diode mixer.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A signal mixer comprising:
   input means for receiving first and second signal sources;
   first unidirectional current conductive means having a first terminal coupled to said input means, a second terminal, and a predetermined polarity therebetween for generating at least one predetermined signal from said first and second signal sources;
   second unidirectional current conductive means having a first terminal coupled to said input means, a second terminal, and a polarity therebetween that is opposite to said predetermined polarity for generating said at least one predetermined signal from said first and second signal sources;

network means coupled between said second terminals of said first and second unidirectional current conductive means for providing coupling therebetween and between said second terminals and a common node; and means for coupling a utilization circuit between said second terminals of said first and second unidirectional current conductive means;

said network means operating to present a low impedance between said second terminals and said common node for said first and second signal sources thereby coupling said first and second unidirectional current conductive means in a parallel relationship and operating to present a high impedance between said second terminals and said common node for said at least one predetermined signal generated from said first and second signal sources thereby coupling said first and second unidirectional current conductive means and said utilization circuit in a series relationship.

2. A signal mixer in accordance with claim 1 wherein said first terminals of said first and second unidirectional current conductive devices are capacitively coupled to said input means.

3. A signal mixer in accordance with claim 2 wherein said network comprises capacitors such that said second terminals of said first and second unidirectional current conductive means are capacitively coupled to said common node.

4. A signal mixer in accordance with claim 3 wherein each of said unidirectional current conductive means are diodes.

5. A signal mixer in accordance with claim 1 wherein said first and second unidirectional current conductive means are diodes.